(12) United States Patent
Hayashida

(10) Patent No.: US 11,239,124 B2
(45) Date of Patent: Feb. 1, 2022

(54) SEMICONDUCTOR DEVICE AND METHOD OF MANUFACTURING SEMICONDUCTOR DEVICE, POWER CONVERSION DEVICE, AND MOVING BODY

(71) Applicant: Mitsubishi Electric Corporation, Tokyo (JP)

(72) Inventor: Yukimasa Hayashida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/487,017

(22) PCT Filed: May 10, 2017

(86) PCT No.: PCT/JP2017/017672
§ 371 (c)(1),
(2) Date: Aug. 19, 2019

(87) PCT Pub. No.: WO2018/207279
PCT Pub. Date: Nov. 15, 2018

(65) Prior Publication Data
US 2020/0243411 A1    Jul. 30, 2020

(51) Int. Cl.
*H01L 23/053* (2006.01)
*H01L 23/24* (2006.01)
(Continued)

(52) U.S. Cl.
CPC .......... *H01L 23/053* (2013.01); *H01L 23/04* (2013.01); *H01L 23/24* (2013.01);
(Continued)

(58) Field of Classification Search
None
See application file for complete search history.

(56) References Cited

U.S. PATENT DOCUMENTS

2016/0071821 A1* 3/2016 Masumoto .......... H01L 23/3675
257/773
2017/0194296 A1* 7/2017 Yasui .................... H01L 25/072

FOREIGN PATENT DOCUMENTS

JP    S59-110141 A    6/1984
JP    H06-350024 A   12/1994
(Continued)

OTHER PUBLICATIONS

An Office Action mailed by the Japanese Patent Office dated Apr. 14, 2020, which corresponds to Japanese Patent Application No. 2019-516789 with English translation.
(Continued)

*Primary Examiner* — Steven B Gauthier
(74) *Attorney, Agent, or Firm* — Studebaker & Brackett PC

(57) ABSTRACT

An object is to provide a technique capable of fixing a cover to a container body without using a dedicated fixation mechanism and fixation member. A semiconductor device includes: a container body having a space with an opening; a semiconductor element disposed in the space in the container body; a sealing member disposed in the space in the container body to cover the semiconductor element; and a cover covering the opening of the container body, wherein a convex portion protruding into the space is provided on the cover, and the cover is fixed to the container body only by embedding at least a tip portion of the convex portion in the sealing member which has been cured.

12 Claims, 4 Drawing Sheets

(51) Int. Cl.
*H01L 23/31* (2006.01)
*H01L 25/18* (2006.01)
*H01L 23/04* (2006.01)
H01L 21/48 (2006.01)
H01L 23/29 (2006.01)
H01L 25/07 (2006.01)

(52) U.S. Cl.
CPC .......... *H01L 23/3142* (2013.01); *H01L 25/18* (2013.01); H01L 21/4817 (2013.01); H01L 23/293 (2013.01); H01L 25/072 (2013.01); H01L 25/074 (2013.01); H01L 2224/32225 (2013.01)

(56) References Cited

FOREIGN PATENT DOCUMENTS

| JP | 2003-068979 A | 3/2003 |
| JP | 2015-041659 A | 3/2015 |

OTHER PUBLICATIONS

International Search Report issued in PCT/JP2017/017672; dated Jul. 18, 2017.

\* cited by examiner

SEMICONDUCTOR DEVICE AND METHOD OF MANUFACTURING SEMICONDUCTOR DEVICE, POWER CONVERSION DEVICE, AND MOVING BODY

TECHNICAL FIELD

The present invention relates to a semiconductor device and a method of manufacturing the semiconductor device, a power conversion device, and a moving body.

BACKGROUND ART

Conventionally, in a highly reliable semiconductor device, a cover is fixed to a container body, which is made up of a case housing, by a dedicated fixation mechanism and a fixation member while the container body is filled with a sealing resin. In a technique in Patent Document 1, for example, a convex portion provided on a lower surface of a cover along an edge portion of the cover is fitted in an inner side of an opening edge portion of a container body, thus the cover is fixed to the container body. In a technique in Patent Document 2, for example, an edge portion of a cover is fitted in a concave portion provided on an opening edge portion of a container body, thus the cover is fixed to the container body. In a technique in Patent Document 3, for example, a cover is fixed to a container body by an adhesive agent.

PRIOR ART DOCUMENTS

Patent Documents

Patent Document 1: Japanese Patent Application Laid-Open No. 06-350024
Patent Document 2: Japanese Patent Application Laid-Open No. 2015-41659
Patent Document 3: Japanese Patent Application Laid-Open No. 2003-68979

SUMMARY

Problem to be Solved by the Invention

However, a space for providing the dedicated fixation mechanism and the fixation member is necessary in the conventional technique, so that there is a limitation on a structure design. As a result, the conventional technique has a problem that a size of the container body cannot be downsized, and then the semiconductor device cannot be downsized, for example.

In the configuration of fixing the cover to the container body by an adhesive agent which is a dedicated fixation member, an adhesive agent applicator and an adhesive agent are necessary, so that there is room for improvement on the number of processes and material cost of the semiconductor device. Moreover, a time of staying in a manufacture line occurs until dedicated processes of applying the adhesive agent and performing a thermal cure, for example, are performed, so that there is a problem that a foreign particle, for example, may enter the container body and then the semiconductor device.

The present invention therefore has been made to solve problems as described above, and it is an object of the present invention to provide a technique capable of fixing a cover to a container body without using a dedicated fixation mechanism and fixation member.

Means to Solve the Problem

A semiconductor device according to the present invention includes: a container body having a space with an opening; a semiconductor element disposed in the space in the container body; a sealing member disposed in the space in the container body to cover the semiconductor element; and a cover covering the opening of the container body, wherein a convex portion protruding into the space is provided on the cover, and the cover is fixed to the container body only by embedding at least a tip portion of the convex portion in the sealing member which has been cured.

Effects of the Invention

According to the present invention, the cover is fixed to the container body only by embedding at least a tip portion of the convex portion in the sealing member which has been cured. Accordingly, the cover can be fixed to the container body without using the dedicated fixation mechanism and fixation member.

These and other objects, features, aspects and advantages of the present invention will become more apparent from the following detailed description of the present invention when taken in conjunction with the accompanying drawings.

DESCRIPTION OF EMBODIMENT(S)

Embodiments are described with reference to the appended drawings hereinafter. Since the drawings are schematically illustrated, a mutual relationship of sizes and positions of constituent elements respectively illustrated in the different drawings is not necessarily illustrated accurately, but may be appropriately changed.

Embodiment 1

Figure 1:
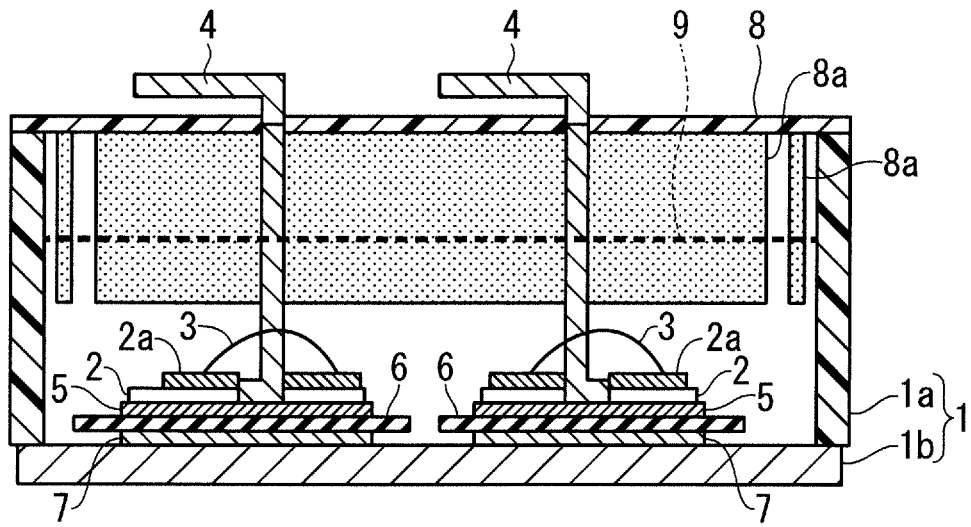
FIG. 1 A cross-sectional view illustrating a configuration of a semiconductor device according to an embodiment 1.

FIG. 1 is a cross-sectional view illustrating a configuration of a highly reliable semiconductor device according to an embodiment 1 of the present invention. The semiconductor device in FIG. 1 includes a container body 1, a semiconductor chip 2 which is a semiconductor element, a metal wiring 3, an electrode 4, solders 5 and 7, an insulating substrate 6, a cover 8, and a sealing member 9. In the drawings subsequent to FIG. 1, the sealing member 9 is not totally illustrated but only an upper surface of the sealing member 9 is illustrated by a broken line so that the drawings do not become complex.

The container body 1 has a space with an opening on an upper side. In the present embodiment 1, the container body 1 includes a circular case 1a and a radiator plate 1b fixed to a lower portion of the case 1a by an adhesive agent. The case 1a constitutes a side surface of the container body 1, and the radiator plate 1b constitutes a bottom surface of the container body 1.

The semiconductor chip 2 is disposed in a space in the container body 1. In the present embodiment 1, the semiconductor chip 2 is joined to a lower surface of the container body 1 via the insulating substrate 6, for example. The semiconductor chip 2 may be, for example, a semiconductor switching element such as an insulated gate bipolar transistor (IGBT) and a metal oxide semiconductor field effect transistor (MOSFET), or may also be a diode such as a schottky barrier diode (SBD).

The semiconductor chip 2 may include, for example, silicon (Si), or may also include a wide bandgap semiconductor. The wide bandgap semiconductor includes, for example, silicon carbide (SiC), gallium nitride (GaN), and diamond. The semiconductor chip 2 is preferably a MOSFET made of SiC or an SBD made of SiC.

The semiconductor chip 2 has an upper electrode 2a, and a plurality of upper electrodes 2a are connected to each other by the metal wiring 3.

Each of the semiconductor chip 2 and the electrode 4 is joined to the insulating substrate 6 by the solder 5. The electrode 4 stands upright on the insulating substrate 6, and drawn outside through an opening of the cover 8. The insulating substrate 6 is joined to the radiator plate 1b by the solder 7.

The cover 8 covers the opening of the container body 1. There is no dedicated fixation mechanism or fixation member for fixing the cover 8 to the container body 1 between the cover 8 and the container body 1, particularly between the cover 8 and an upper side of the case 1a. The fixation mechanism is a fit mechanism, for example, and the fixation member is an adhesive agent, for example.

An inner wall 8a which is a convex portion protruding into the space in the container body 1 is provided on the cover 8. The inner wall 8a is provided along but separately from the case 1a of the container body 1. In the present embodiment 1, the inner wall 8a and the cover 8 are integrally formed by integral molding, however, the configuration is not limited thereto.

The sealing member 9 has insulation properties. The sealing member 9 is disposed in the space in the container body 1, and covers the semiconductor chip 2 to protect the semiconductor chip 2. When the sealing member 9 is in liquid form of an uncured state immediately after the sealing member 9 is injected in the space in the container body 1, for example, the cover 8 is placed on the upper side of the case 1a in a state where a tip portion of the inner wall 8a is located on a side lower than an upper surface (liquid surface) of the sealing member 9. Then, the sealing member 9 is cured in that state.

In the present embodiment 1 having such a configuration, the cover 8 is fixed to the container body 1 only by embedding at least the tip portion of the inner wall 8a in the cured sealing member 9. That is to say, the curing of the sealing member 9 is used to fix the cover 8 to the container body 1.

Described herein is an example of materials of the constituent elements described above. The materials of the case 1a, the cover 8, and the inner wall 8a include, for example, polyphenylene sulfide (PPS), polybutylene terephthalate (PBT), and engineering plastic. The engineering plastic includes, for example, plastic made by synthesizing polyethylene terephthalate (PET) and PBT. The materials of the cover 8 and the inner wall 8a may be the same or different from each other.

The material of the radiator plate 1b includes, for example, a metal ceramic composite such as AlSiC and a metal such as Cu or Al. The adhesive agent for fixing the case 1a to the radiator plate 1b includes, for example, a material of silicon series and a material of epoxy series. The material of the sealing member 9 includes, for example, a silicon gel and an epoxy resin.

According to the semiconductor device in the present embodiment 1 described above, the cover 8 is fixed to the container body 1 only by embedding at least the tip portion of the inner wall 8a in the cured sealing member 9. According to such a configuration, the cover and the container body can be fixed to each other without using the dedicated fixation mechanism and fixation member. As a result, downsizing and weight saving of the semiconductor device, reduction in a material cost, high quality achieved by suppressing entrance of foreign particles, and improvement of productivity achieved by reducing the number of processes, for example, can be expected.

When the semiconductor chip 2 includes a wide bandgap semiconductor, it is assumed that the semiconductor device including the semiconductor chip 2 is used in a high-temperature environment. According to the configuration in the present embodiment 1 that the cover 8 is fixed to the container body 1 only by embedding at least the tip portion of the inner wall 8a in the cured sealing member 9, an occurrence of unnecessary thermal stress can be suppressed and the thermal stress which has occurred can be let out. Accordingly, the configuration described above is particularly effective in the case where the semiconductor chip 2 includes the wide bandgap semiconductor.

Embodiment 2

Figure 2:
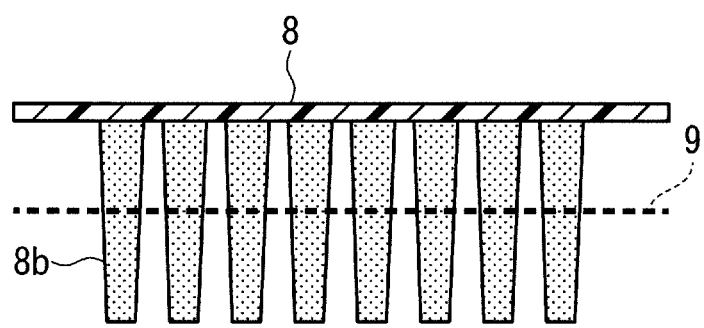
FIG. 2 A cross-sectional view illustrating a configuration of a part of a semiconductor device according to an embodiment 2.

FIG. 2 is a cross-sectional view illustrating a configuration of a part of a highly reliable semiconductor device according to an embodiment 2 of the present invention. The same reference numerals as those described in the present embodiment 2 will be assigned to the same or similar constituent elements described above, and the different constituent elements are mainly described hereinafter.

In the present embodiment 2, a plurality of comb-like parts 8b are provided on the cover 8 as a plurality of convex portions, and the cover 8 and the plurality of comb-like parts 8b constitute comb-like member. At least tip portions of the plurality of comb-like parts 8b are embedded in the cured sealing member 9. According to such a configuration, adhesion between the plurality of comb-like parts 8b and the sealing member 9 can be increased, thus the fixation between the cover 8 and the container body 1 can be strengthened. An amount of the molding material used in the plurality of comb-like parts 8b can be smaller than the molding material used in the inner wall 8a in the embodiment 1, thus reduction in a cost of the semiconductor device can be expected.

Embodiment 3

Figure 3:
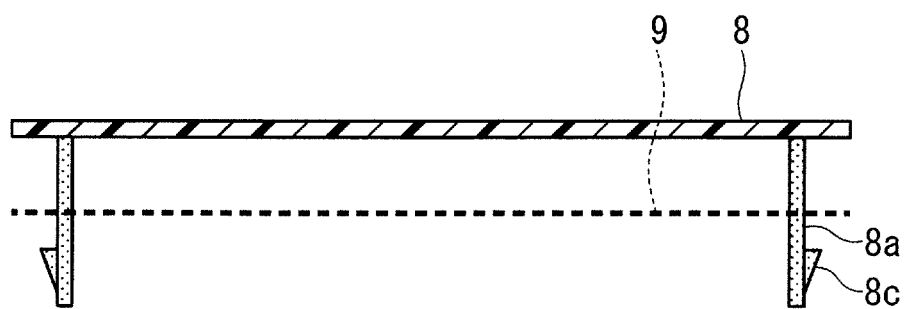
FIG. 3 A cross-sectional view illustrating a configuration of a part of a semiconductor device according to an embodiment 3.

FIG. 3 is a cross-sectional view illustrating a configuration of a part of a highly reliable semiconductor device according to an embodiment 3 of the present invention. The same reference numerals as those described in the present embodiment 3 will be assigned to the same or similar constituent elements described above, and the different constituent elements are mainly described hereinafter.

In the present embodiment 3, a hook part 8c is provided on the tip portion of the inner wall 8a described in the embodiment 1, and the tip portion of the inner wall 8a has a hook-like shape. The hook part 8c is embedded in the cured sealing member 9. According to such a configuration, mechanical locking force can be obtained by anchor effect of the hook part 8c, thus the fixation between the cover 8 and the container body 1 can be strengthened.

Embodiment 4

Figure 4:
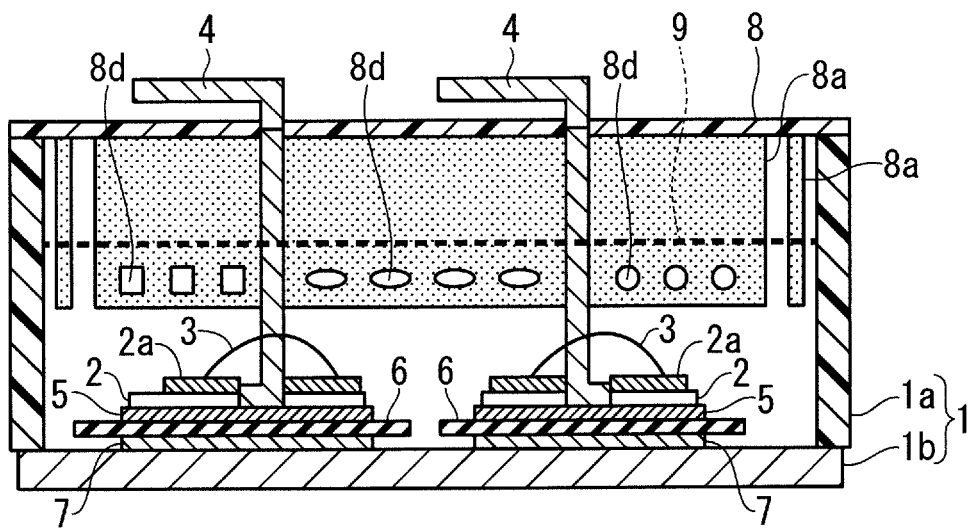
FIG. 4 A cross-sectional view illustrating a configuration of a semiconductor device according to an embodiment 4.

FIG. 4 is a cross-sectional view illustrating a configuration of a highly-reliable semiconductor device according to an embodiment 4 of the present invention. The same reference numerals as those described in the present embodiment 4 will be assigned to the same or similar constituent elements described above, and the different constituent elements are mainly described hereinafter.

In the present embodiment 4, an opening part 8d is provided on a side of the tip portion of the inner wall 8a described in the embodiment 1. The opening part 8d is filled with part of the sealing member 9. According to such a configuration, anchor effect can be obtained by the opening part 8d filled with the part of the cured sealing member 9, thus the fixation between the cover 8 and the container body 1 can be strengthened. The opening part 8d may be a hole with a bottom or a through-hole. The opening part 8d may be a circle hole, a rectangle hole, or an oval hole.

Embodiment 5

Figure 5:
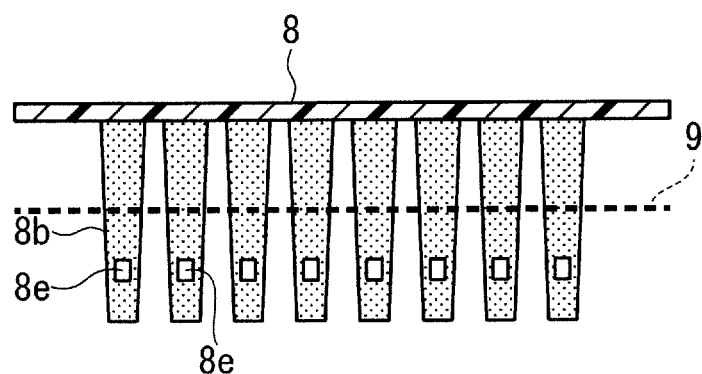
FIG. 5 A cross-sectional view illustrating a configuration of a part of a semiconductor device according to an embodiment 5.

FIG. 5 is a cross-sectional view illustrating a configuration of a part of a highly reliable semiconductor device according to an embodiment 5 of the present invention. The same reference numerals as those described in the present embodiment 5 will be assigned to the same or similar constituent elements described above, and the different constituent elements are mainly described hereinafter.

In the present embodiment 5, an opening part 8e is provided on a side of each tip portion of the plurality of comb-like parts 8b described in the embodiment 2. The opening part 8e is filled with part of the cured sealing member 9. According to such a configuration, anchor effect can be obtained by the opening part 8e filled with the part of the cured sealing member 9. Accordingly, in the present embodiment 5, not only adhesion between the plurality of comb-like parts 8b and the sealing member 9 can be increased in the manner similar to the embodiment 2, but also mechanical locking force can be obtained by anchor effect, thus the fixation between the cover 8 and the container body 1 can be further strengthened.

Embodiment 6

Figure 6:
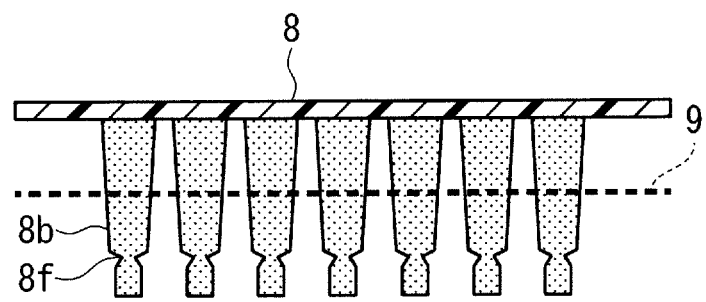
FIG. 6 A cross-sectional view illustrating a configuration of a part of a semiconductor device according to an embodiment 6.

FIG. 6 is a cross-sectional view illustrating a configuration of a part of a highly reliable semiconductor device according to an embodiment 6 of the present invention. The same reference numerals as those described in the present embodiment 6 will be assigned to the same or similar constituent elements described above, and the different constituent elements are mainly described hereinafter.

In the present embodiment 6, a constricted part 8f is provided on an edge of each tip portion of the plurality of comb-like parts 8b described in the embodiment 2, and the edge has a constricted shape. The constricted part 8f is embedded in the cured sealing member 9. According to such a configuration, anchor effect can be obtained by the constricted part 8f filled with the part of the cured sealing member 9. Accordingly, in the present embodiment 6, not only adhesion between the plurality of comb-like parts 8b and the sealing member 9 can be increased in the manner similar to the embodiment 2, but also mechanical locking force can be obtained by anchor effect, thus the fixation between the cover 8 and the container body 1 can be further strengthened.

Embodiment 7

Figure 7:
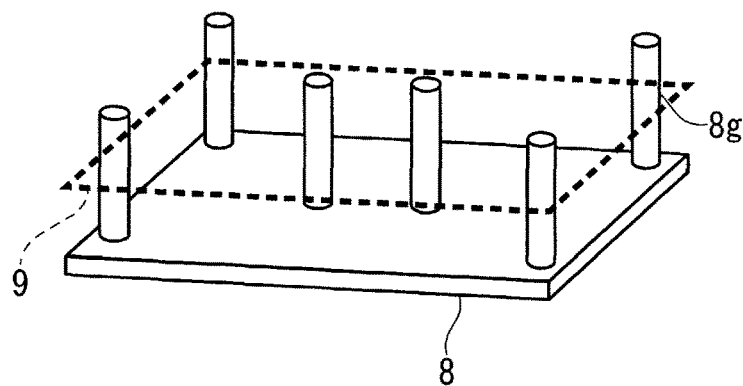
FIG. 7 A perspective view illustrating a configuration of a part of a semiconductor device according to an embodiment 7.

FIG. 7 is a perspective view illustrating a configuration of a part of a highly reliable semiconductor device according to an embodiment 7 of the present invention. FIG. 7 illustrates a configuration of turning the configurations in FIG. 1 to FIG. 6 upside down. The same reference numerals as those described in the present embodiment 7 will be assigned to the same or similar constituent elements described above, and the different constituent elements are mainly described hereinafter.

In the present embodiment 7, a plurality of columns 8g each having a cylindrical shape are provided on the cover 8 as a plurality of convex portions. Each of the columns 8g has the cylindrical shape in the description herein, however, the configuration is not limited thereto, thus each of the columns 8g may have a conical shape. Herein, the four columns 8g are provided on corner sides of the cover 8 having a square shape, and the two columns 8g are provided on a center side of the cover 8. However, the number of the columns 8g is not limited to the number described above, but may be three or the other number, for example. The position of the column 8g is not limited to the position described above, thus the column 8g may be provided in a desired position.

In the present embodiment 7, at least tip portions of the plurality of columns 8g are embedded in the cured sealing member 9. According to such a configuration, the column 8g having a smaller size than that of the inner wall 8a can be provided in a position where the inner wall 8a cannot provided. Accordingly, the configuration in the present embodiment 7 is effective in the case where the inner wall 8a cannot be provided.

Embodiment 8

Figure 8:
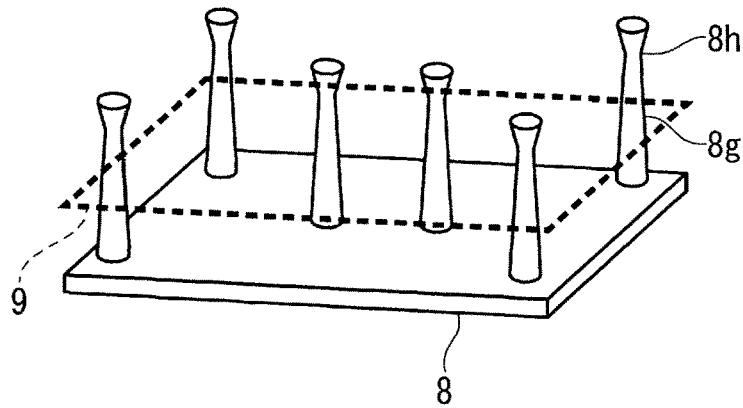
FIG. 8 A perspective view illustrating a configuration of a part of a semiconductor device according to an embodiment 8.

FIG. 8 is a perspective view illustrating a configuration of a part of a highly reliable semiconductor device according to an embodiment 8 of the present invention. FIG. 8 illustrates a configuration of turning the configurations in FIG. 1 to FIG. 6 upside down. The same reference numerals as those described in the present embodiment 8 will be assigned to the same or similar constituent elements described above, and the different constituent elements are mainly described hereinafter.

In the present embodiment 8, a column 8g similar to that in the embodiment 7 is formed by insert-molding a metal. A constricted part 8h is provided on an edge of the tip portion of the column 8g according to the present embodiment 8 by the insert molding. That is to say, the edge of the tip portion of the column 8g has a constricted shape. The constricted part 8h is embedded in the cured sealing member 9. According to such a configuration, the metal is insert-molded, thus mechanical locking force, for example, can be obtained by anchor effect, thus the fixation between the cover 8 and the container body 1 can be strengthened.

Embodiment 9

A power conversion device according to an embodiment 9 of the present invention is a power conversion device including a main conversion circuit having the semiconductor device according to any one of the embodiments 1 to 8. Although the semiconductor device described above is not limited to a specific power conversion device, described hereinafter as the present embodiment 9 is a case of applying the semiconductor device according to any one of the embodiments 1 to 8 to a three-phase inverter.

Figure 9:
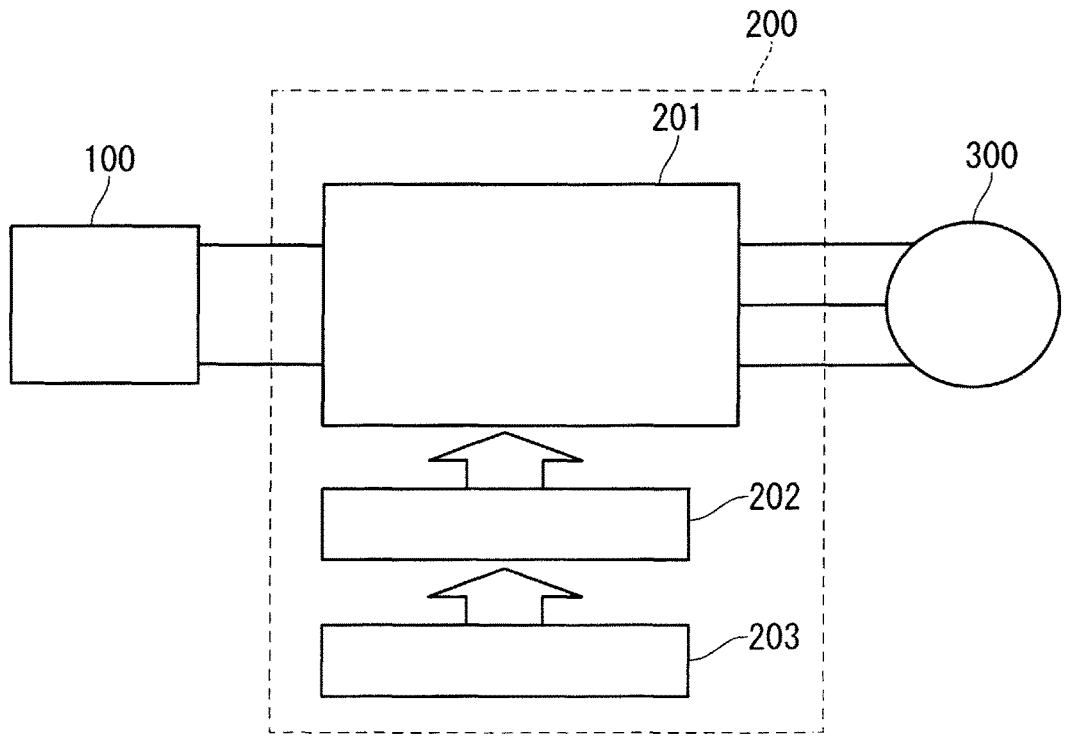
FIG. 9 A block diagram illustrating a configuration of a power conversion system according to an embodiment 9.

FIG. 9 is a block diagram illustrating a configuration of a power conversion system applying the power conversion device according to the present embodiment 9.

The power conversion system illustrated in FIG. 9 is made up of a power source 100, a power conversion device 200, and a load 300. The power source 100, which is a direct current power source, supplies a direct current power to the power conversion device 200. The power source 100 can be made up of various types of power sources, thus may be made up of a direct-current system, a solar battery, or a storage battery, or may be made up of a rectification circuit connected to an alternating-current system or an AC/DC converter, for example. The power source 100 may also be made up of a DC/DC converter which converts a direct current power being output from the direct current system into a predetermined power.

The power conversion device 200, which is a three-phase inverter connected between the power source 100 and the load 300, converts the direct current power supplied from the power source 100 into the alternating current power to supply the alternating current power to the load 300. As illustrated in FIG. 9, the power conversion device 200 includes a main conversion circuit 201 converting the direct current power into the alternating current power and outputting the alternating current power, a drive circuit 202 outputting a drive signal for driving each switching element in the main conversion circuit 201, and a control circuit 203 outputting a control signal for controlling the drive circuit 202 to the drive circuit 202.

The load 300 is a three-phase electrical motor driven by the alternating current power supplied from the power conversion device 200. The load 300 is not for specific purpose of use but is the electrical motor mounted on various types of electrical devices, thus it is used as the electrical motor for a hybrid car, an electrical car, a rail vehicle, an elevator, or an air-conditioning equipment, for example.

The power conversion device 200 is described in detail hereinafter. The main conversion circuit 201 includes a switching element and a reflux diode (not shown), and when a switching is performed on the switching element, the direct current power supplied from the power source 100 is converted into the alternating current power and then supplied to the load 300. The main conversion circuit 201 includes various types of specific circuit configurations, and the main conversion circuit 201 according to the present embodiment 9 is a three-phase full-bridge circuit having two levels, and the three-phase full-bridge circuit can be made up of six switching elements and six reflux diodes being antiparallel to each of each of the switching elements. The semiconductor chip 2 of the semiconductor device according to any one of the aforementioned embodiments 1 to 8 is applied to at least one of each switching element and each reflux diode in the main conversion circuit 201. The two switching elements among the six switching elements are series-connected to each other to constitute upper and lower arms, and each of the upper and lower arms constitutes each phase (U-phase, V-phase, and W-phase) of the full-bridge circuit. An output terminal of each of the upper and lower arms, that is to say, three output terminals of the main conversion circuit 201 are connected to the load 300.

The drive circuit 202 generates the drive signal for driving the switching element of the main conversion circuit 201, and supplies the drive signal to a control electrode of the switching element of the main conversion circuit 201. Specifically, the drive circuit 202 outputs the drive signal for switching the switching element to an ON state and the drive signal for switching the switching element to an OFF state to the control electrode of each switching element in accordance with the control signal from the control circuit 203 described hereinafter. The drive signal is a voltage signal (ON signal) equal to or higher than a threshold voltage of the switching element when the switching element is kept in the ON state, and the drive signal is a voltage signal (OFF signal) equal to or lower than the threshold voltage of the switching element when the switching element is kept in the OFF state.

The control circuit 203 controls the switching element of the main conversion circuit 201 to supply a desired power to the load 300. Specifically, the control circuit 203 calculates a time when each switching element of the main conversion circuit 201 needs to enter the ON state (ON time), based on the electrical power which needs to be supplied to the load 300. For example, the control circuit 203 can control the main conversion circuit 201 by performing pulse width modulation (PWM) control for modulating the ON time of the switching element in accordance with the voltage which needs to be output. Then, the control circuit 203 outputs a control instruction (control signal) to the drive circuit 202 so that the drive circuit 202 outputs the ON signal to the switching element which needs to enter the ON state and outputs the OFF signal to the switching element which needs to enter the OFF state at each time. The drive circuit 202 outputs the ON signal or the OFF signal as the drive signal to the control electrode of each switching element in accordance with the control signal.

In the power conversion device according to the present embodiment 9 described above, the semiconductor chip 2 of the semiconductor device according to the embodiments 1 to 8 is applied as at least one of the switching element and the reflux diode in the main conversion circuit 201, thus the improvement of the reliability can be achieved.

Although the example of applying the semiconductor chip 2 of the semiconductor device according to any one of the embodiments 1 to 8 to the three-phase inverter having the two levels is described in the present embodiment 9 described above, the present embodiment 9 is not limited thereto, but can be applied to the various power conversion devices. Although the semiconductor device according to any one of the embodiments 1 to 8 is the power conversion device having the two levels in the present embodiment 9, a power conversion device having three or multiple levels may also applied. The semiconductor device described above may be applied to a single-phase inverter when the electrical power is supplied to a single-phase load. The semiconductor device can be applied to a DC/DC converter or an AC/DC converter when the electrical power is supplied to a direct current load, for example.

The load in the power conversion device according to the present embodiment 9 is not limited to the electrical motor as described above, but an electrical discharge machine or a laser beam machine may also be the load. The power conversion device can also be used as a power-supply device of an induction heat cooking device or a non-contact power feeding system, and can also be further used as a power conditioner of a solar power system or an electricity storage system, for example.

Embodiment 10

Figure 10:
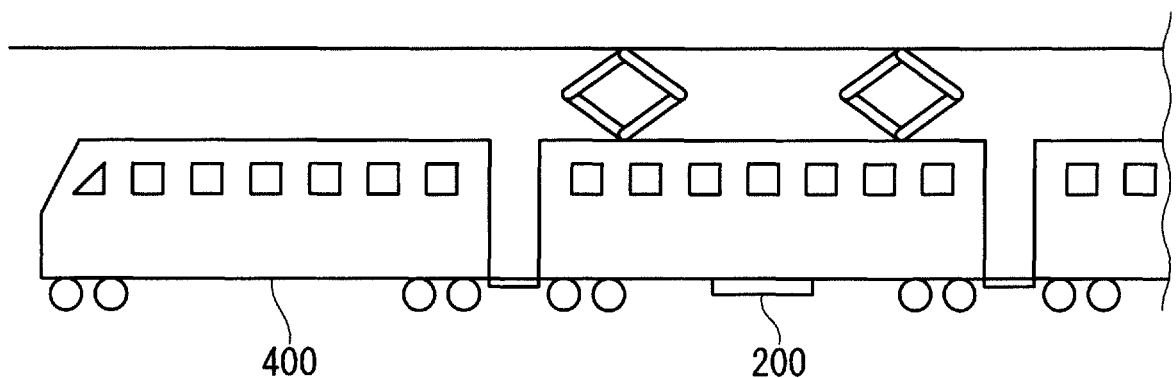
FIG. 10 A block diagram illustrating a configuration of a moving body according to an embodiment 10.

FIG. 10 is a drawing illustrating a configuration of a moving body according to an embodiment 10 of the present invention. The power conversion device 200 according to the embodiment 9 is mounted on a moving body 400 illustrated in FIG. 10, and the moving body 400 can move using an output from the power conversion device 200. According to such a configuration, weight saving of the moving body 400 can be achieved by downsizing and weight saving of the converter. As a result, high efficiency and technical advantages in the moving body 400 can be expected. The moving body 400 is described herein as a rail vehicle, however, the moving body 400 is not limited thereto but may also be a hybrid car, an electrical car, or an elevator, for example.

According to the present invention, each embodiment can be arbitrarily combined, or each embodiment can be appropriately varied or omitted within the scope of the invention.

The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 1 container body, 2 semiconductor chip, 8 cover, 8a inner wall, 8b comb-like part, 8c hook part, 8d, 8e opening part, 8f, 8h constricted part, 8g column, 9 sealing member, 200 power conversion device, 201 main conversion circuit, 202 drive circuit, 203 control circuit, 400 moving body

The invention claimed is:

1. A semiconductor device, comprising:
a container body having a space with an opening;
a semiconductor element disposed in the space in the container body;
a sealing member disposed in the space in the container body to cover the semiconductor element; and
a cover covering the opening of the container body, wherein
at least one convex portion protruding into the space from a surface of the cover, and
the cover is fixed to the container body only by embedding at least a tip portion of the at least one convex portion in the sealing member which has been cured, so that the sealing member does not directly contact the surface of the cover.

2. The semiconductor device according to claim 1, wherein
a plurality of the convex portions are provided on the cover.

3. The semiconductor device according to claim 1, wherein
the tip portion of the convex portion has a hook-like shape.

4. The semiconductor device according to claim 1, wherein
an opening part is provided on a side of the tip portion of the convex portion.

5. The semiconductor device according to claim 1, wherein
an edge of the tip portion of the convex portion has a constricted shape.

6. The semiconductor device according to claim 1, wherein
the convex portion includes a column with a cylindrical shape or a conical shape.

7. A method of manufacturing the semiconductor device according to claim 6, wherein
the convex portion is formed by insert-molding a metal.

8. The semiconductor device according to claim 1, wherein
the semiconductor element includes a wide bandgap semiconductor.

9. A power conversion device, comprising:
a main conversion circuit having the semiconductor device according to claim 1, and converting and outputting an electrical power being input to the main conversion circuit;
a drive circuit outputting a drive signal for driving the semiconductor device to the semiconductor device; and
a control circuit outputting a control signal for controlling the drive circuit to the drive circuit.

10. A moving body on which the power conversion device according to claim 9 is mounted.

11. A semiconductor device, comprising:
a container body having a space with an opening;
a semiconductor element disposed in the space in the container body;
an electrode connecting the semiconductor element to an exterior of the container body;
a sealing member disposed in the space in the container body to cover the semiconductor element; and
a cover covering the opening of the container body, wherein
at least one convex portion protruding into the space is provided on the cover, and
the cover is fixed to the container body only by embedding at least a tip portion of the at least one convex portion in the sealing member which has been cured.

12. A semiconductor device, comprising:
a container body having a space with an opening;
a semiconductor element disposed in the space in the container body;
a sealing member disposed in the space in the container body to cover the semiconductor element; and
a cover covering the opening of the container body, wherein
at least one convex portion protruding into the space is provided on the cover, the at least one convex portion being formed of a same material as the cover, and
the cover is fixed to the container body only by embedding at least a tip portion of the at least one convex portion in the sealing member which has been cured.

* * * * *